United States Patent
Zur

(10) Patent No.: US 7,683,621 B1
(45) Date of Patent: Mar. 23, 2010

(54) SYSTEM AND METHOD FOR TISSUE POINT TRACKING USING MAGNETIC RESONANCE IMAGING

(75) Inventor: Yuval Zur, Haifa (IL)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/206,266

(22) Filed: Sep. 8, 2008

(51) Int. Cl.
*G01V 3/00* (2006.01)

(52) U.S. Cl. ...................... 324/309; 324/307

(58) Field of Classification Search ......... 324/300–322; 600/407–445; 382/128; 424/9.3
See application file for complete search history.

(56) References Cited

U.S. PATENT DOCUMENTS

| | | | | |
|---|---|---|---|---|
| 4,556,848 A | * | 12/1985 | Eberhard | 324/309 |
| 6,556,856 B1 | * | 4/2003 | Mistretta et al. | 600/420 |
| 6,587,707 B2 | | 7/2003 | Nehrke et al. | |
| 6,757,219 B2 | * | 6/2004 | Larosa et al. | 367/124 |
| 7,054,675 B2 | | 5/2006 | Ma et al. | |
| 7,145,334 B2 | * | 12/2006 | Assmann et al. | 324/306 |
| 7,542,544 B2 | * | 6/2009 | Rubin et al. | 378/62 |
| 2007/0197896 A1 | * | 8/2007 | Moll et al. | 600/407 |
| 2009/0161827 A1 | * | 6/2009 | Gertner et al. | 378/65 |

* cited by examiner

Primary Examiner—Brij B Shrivastav
(74) *Attorney, Agent, or Firm*—Ziolkowski Patent Solutions Group, SC

(57) ABSTRACT

A system and method for MR based tracking of a tissue point includes a RF coil assembly configured to emit RF pulse sequences and a system control coupled to the RF coil assembly. The system control is programmed to cause the RF coil assembly to emit a first RF pulse comprising a first pair of two-dimensional (2D) spatially selective beams, each of the beams being directed to a respective tagging location in the subject of interest and wherein the tagging locations are equidistant from a pre-determined point-of-interest. The system control is further programmed to acquire a first series of MR images from a subject of interest, identify the first pair of 2D spatially selective beams in each MR image in the first series of MR images, and track a position of the point-of-interest based on the identified 2D spatially selective beams in the first series of MR images.

23 Claims, 4 Drawing Sheets

SYSTEM AND METHOD FOR TISSUE POINT TRACKING USING MAGNETIC RESONANCE IMAGING

BACKGROUND OF THE INVENTION

Embodiments of the invention relate generally to magnetic resonance (MR) imaging, and more particularly, to MR based tracking of a tissue point using a double pencil beam RF pulse.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR (nuclear magnetic resonance) signals are digitized and processed to reconstruct the image using one of many well known reconstruction techniques.

In addition to being used for the purpose of standard medical imaging procedures, MR imaging has increasingly been integrated into surgical procedures. That is, MR imaging is now used as a guidance system in certain surgical or therapy procedures. One such procedure is focused ultrasound therapy and/or surgery, in which ultrasound energy is delivered to localized regions of tissue from externally-located (non-invasive) or internally-located (minimally invasive) transducers. The amount of ultrasound energy delivered to tissue dictates the nature of the biologic effect produced at that location and can, for example, induce thermal coagulation of tissue, vascular occlusion or hemorrhage, permeation of cells, and tissue-homogenization.

When performing focused ultrasound procedures, it is desirable to provide precise control and steering of the acoustic field by making use of MR images. MR imaging enables precise targeting of structures for treatment planning, on-line temperature mapping and imaging for monitoring and control of therapy, and results in excellent visualization of the biological response to treatment. That is, an MRI system may be used to plan a focused ultrasound procedure by performing an initial scan to locate a target tissue region and/or to plan a trajectory between an entry point and the tissue region in preparation for a procedure. Once the target tissue region has been identified, MRI may be used during the procedure, for example, to image the tissue region and/or to guide the trajectory of an external ultrasound beam to a target tissue region being treated. In addition, an MRI system may be used to monitor the temperature of the tissue region during the procedure, for example, to ensure that only the target tissue region is destroyed during an ablation procedure without damaging surrounding healthy tissue.

The physiological motion of tissue in vivo, whether due to the respiratory cycle or cardiac cycle, can make it difficult to track a target point of tissue that is being treated by the focused ultrasound when that target point is constantly in motion. Real-time tracking during focused ultrasound ablation is important in avoiding the heating of an unwanted area and in delivering focused ultrasound to target location so as to reach a target temperature thereat. While various tissue point tracking techniques are currently in use, such techniques typically use preliminary imaging procedures (i.e., a learning phase) and/or may experience data latency issues that affect the timeliness of the ultrasound application.

It would therefore be desirable to have a system and method of target point tracking in tissue that allows for direct measurement/tracking of the location of the target point without a learning phase. It is further desired that the system and method minimize data latency in the target point tracking so as to improve the accuracy and timeliness of location data on the target point.

BRIEF DESCRIPTION OF THE INVENTION

In accordance with one aspect of the invention, a magnetic resonance imaging (MRI) apparatus includes a plurality of gradient coils positioned about a bore of a magnet, an RF coil assembly coupled to a pulse generator to emit RF pulse sequences and arranged to receive resulting MR signals from a subject of interest, and a system control coupled to the plurality of gradient coils and the RF coil assembly. The system control is programmed to cause the RF coil assembly to emit a first RF pulse comprising a first pair of two-dimensional (2D) spatially selective beams, each of the beams being directed to a respective tagging location in the subject of interest and wherein the tagging locations are equidistant from a pre-determined point-of-interest. The system control is further programmed to acquire a first series of MR images from the subject of interest, identify the first pair of 2D spatially selective beams in each MR image in the first series of MR images, and track a position of the point-of-interest based on the identified 2D spatially selective beams in the first series of MR images.

In accordance with another aspect of the invention, a method for tracking a target point using magnetic resonance imaging (MRI) includes the steps of identifying a target point in a subject of interest, emitting a first tagging RF pulse to a first set of tagging locations positioned equidistant from and on opposite sides of the target point, and acquiring a first set of MR images from the subject of interest. The method also includes the steps of tracking a position of the first set of tagging locations over the first set of MR images and determining a location for the target point in each of the acquired MR images based on the tracked positions of the first set of tagging locations, wherein the first tagging RF pulse comprises a first two-dimensional (2D) pencil beam and a second two-dimensional (2D) pencil beam, each of the first and second 2D pencil beams directed to a respective tagging location in the first set of tagging locations.

In accordance with yet another aspect of the invention, a computer readable storage medium has a computer program stored thereon representing a sequence of instructions. When executed by a computer, the computer program causes the computer to cause transmission of a pair of pencil beam RF pulses positioned about a point-of-interest located at a midpoint between the pair of pencil beam RF pulses and acquire a plurality of magnetic resonance (MR) images during the transmission of the pair of pencil beam RF pulses. The computer program further causes the computer to track a location of saturation points generated by the pair of pencil beam RF pulses over the plurality of MR images and determine a shift in location of the point-of-interest in each of the plurality of MR images based on the location of the saturation points.

These and other advantages and features will be more readily understood from the following detailed description that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

A system and method for tracking a target point of tissue using a double pencil beam RF pulse is provided. In this regard, an RF pulse is applied to an imaged tissue that is comprised of two symmetrical Gaussian-shaped 2D pencil beams. The pencil beams saturate a small area at a distance from both sides of the target point. For tissue exhibiting an approximately constant strain tensor around the target point, the target point will remain at the mid-point between the two pencil beam saturation points. The target point can thus be continuously tracked without affecting its NMR signal by acquiring NMR images and locating the position of the two pencil beams.

Figure 1:
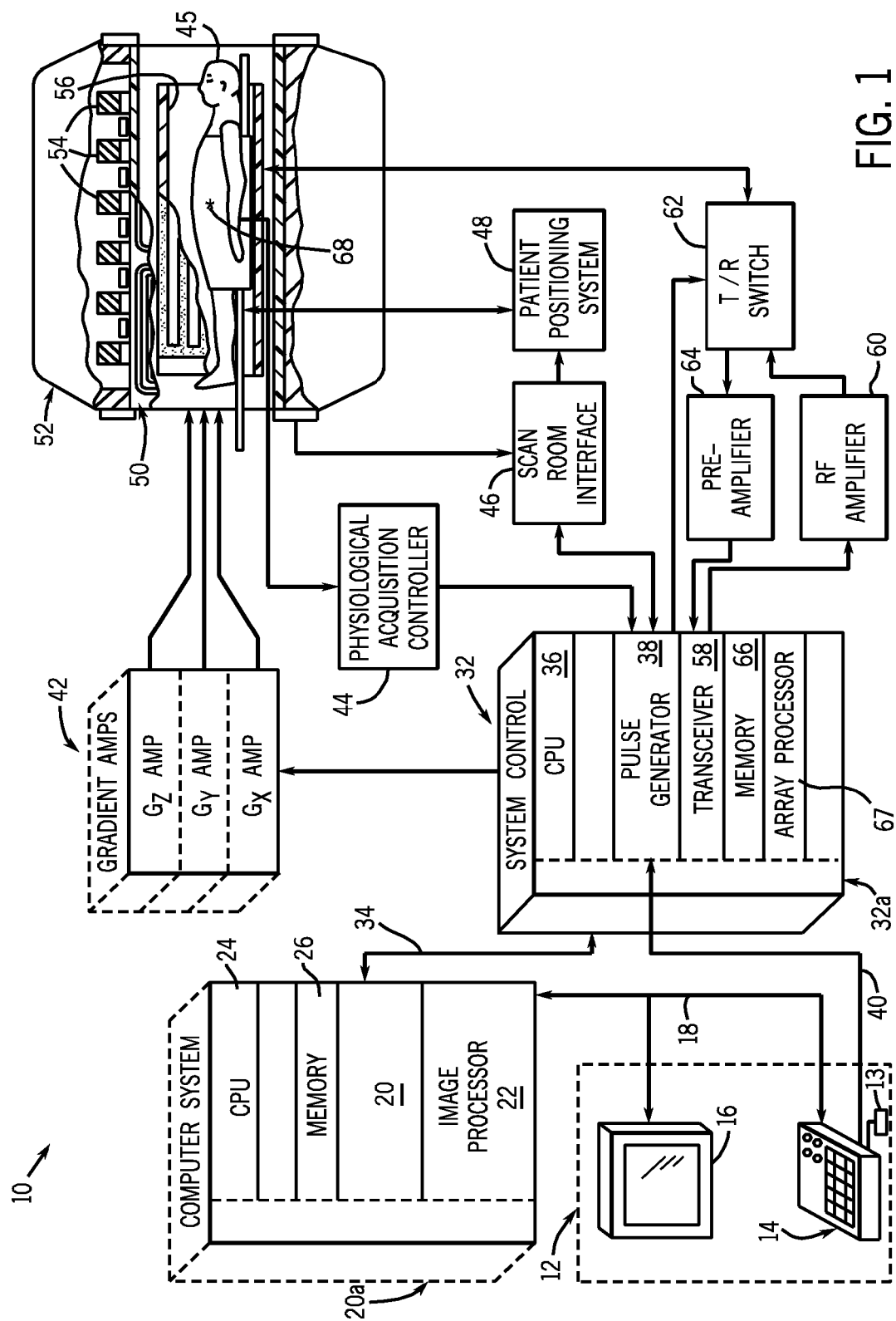
FIG. 1 is a schematic block diagram of an exemplary MR imaging system incorporating embodiments of the invention.

Referring to FIG. 1, the major components of an exemplary magnetic resonance imaging (MRI) system 10 incorporating embodiments of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back up memory or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient 45, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 67 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

MRI system 10 is further configured to allow for the tracking of a target point 68 (i.e., point-of-interest) in patient 45. The target point (or location) 68 can, for example, comprise a target point within biological tissue of the patient, such as a pre-determined point in the liver. MRI system 10 provides for tracking of the target point 68 via the application of a series of RF pulses (i.e., an initial RF pulse and a subsequent RF pulse) used to "tag" locations adjacent to the target point. System control 32 causes the RF coil assembly 56 to emit RF pulses that saturate these tagging locations.

Figure 2:
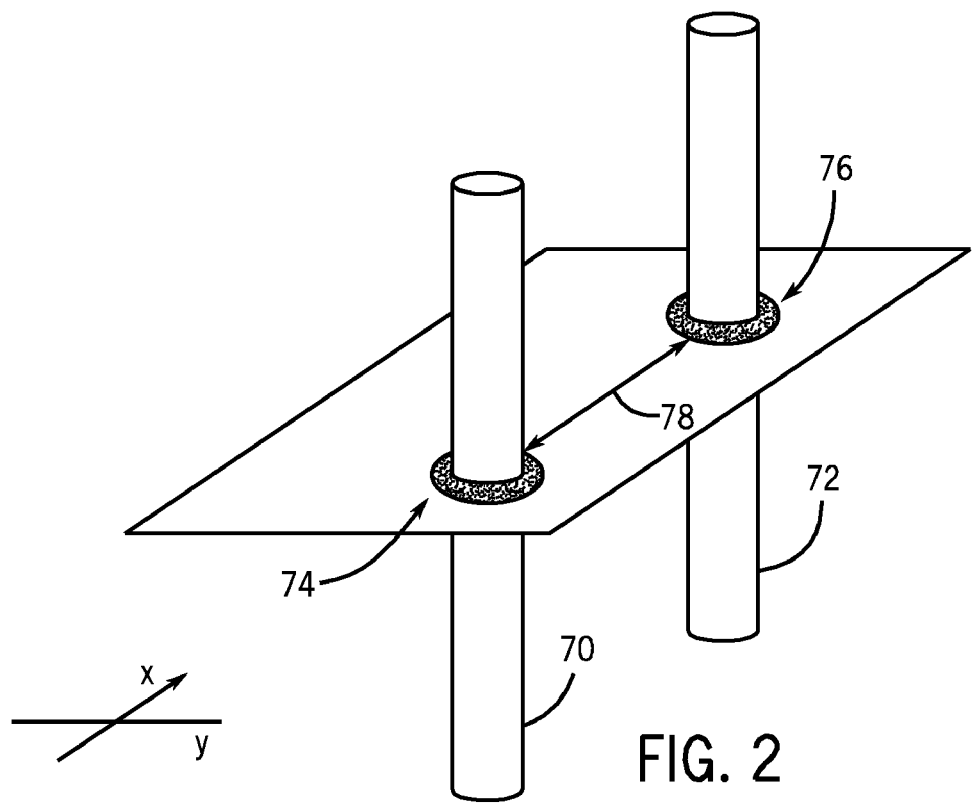
FIG. 2 is a diagram of radio frequency (RF) pencil beams at tagging locations relative to a target point in accordance with an embodiment of the invention.

Referring now to FIG. 2, a pair of RF pulses comprises a pair of two-dimensional (2D), spatially-selective RF beams 70, 72, which are shaped into a long strip or cylinder of magnetization by gradient waveforms applied by gradient coil assembly 50 (FIG. 1) that are played out on two independent gradient axes (e.g., Gx and Gy). Ideally, the 2D, spatially-selective RF beams 70, 72 are configured as two symmetrical Gaussian-shaped 2D RF pencil beams ("RF pencil beams"). The RF pencil beams 70, 72 are directed to tagging locations 74, 76, which are positioned at equidistant and opposite locations from target point 78. That is, target point 78 is positioned at a mid-point between the first tagging location 74 and the second tagging location 76. For tissue exhibiting an approximately constant strain tensor around the target point 78, the target point 78 will remain at the mid-point between the tagging locations 74, 76 created by RF pencil beams 70, 72. The target point 78 can thus be continuously tracked by acquiring MR images and locating the position of the two RF pencil beams 70, 72 in each of those images. RF pencil beams directed toward tagging locations located along a common axis, such as the x-, y-, or z-axis, may be referred to, respectively, as producing an "x-tag", "y-tag", or "z-tag" at the tagging locations. For example, the RF pencil beams 70, 72 produce an x-tag at the tagging locations 74, 76 when tagging locations 74, 76 lie along the x-axis.

Each of the RF pencil beams 70, 72 is configured to spatially saturate the tissue at tagging locations 74, 76 so as to remove unwanted signals therefrom. The tagging pencil beams 70, 72 use a spatially-selective 90 degree RF pulse, which is applied immediately before a slice excitation RF pulse, to flip longitudinal magnetization into the transverse plane over one or more selected areas, such as the tagging locations 74, 76. In one embodiment, the transverse magnetization is nulled by applying a dephasing gradient pulse so that prior to an application of the slice excitation RF pulse the magnetization at the tagging locations 74, 76 is close to zero and the signal generated from the tagging locations 74, 76 is approximately zero. Accordingly, the tagging locations 74, 76 may be identified by locating the areas with a minimum signal. As mentioned above, the target point 78 will be at the mid-point between the tagging locations 74, 76 and can be tracked by acquiring MR images and locating the position of the two RF pencil beams 70, 72 in each of these images.

Figure 3:
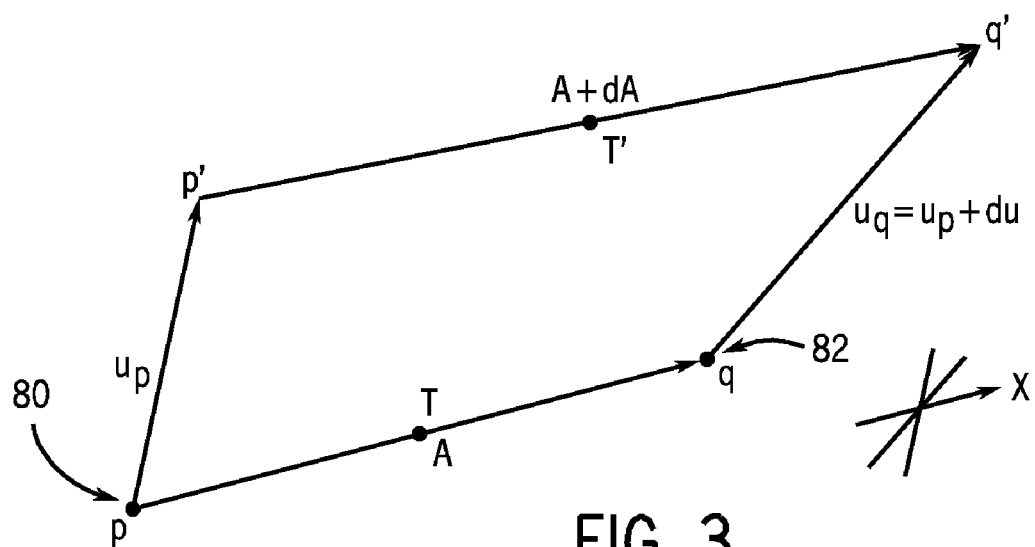
FIG. 3 is a schematic diagram of target point displacement and tracking in accordance with an embodiment of the invention.

Referring now to FIG. 3, the displacement of two tagging locations in a rigid homogeneous body, such as biological tissue, due to a strain is illustrated. Tagging locations or points p and q correspond to locations in a rigid homogenous body at which a first pair of RF pencil beams 80, 82, are respectfully directed. In an embodiment of the invention, RF pencil beams 80, 82 correspond to RF pencil beams as described above. A target point T lies on a midpoint between tagging locations p, q. The location of points p, q are preferably known prior to initiation of a medical imaging procedure. Assuming that the rigid body exhibits an approximately constant strain tensor around the target point T, a Taylor series can be used to track displacement of T. The Taylor series of a function u of two variables x and y at location q is:

$$u(q) = u(p) + \frac{\partial u(p)}{\partial x} \cdot (x_q - x_p) + \frac{\partial u(p)}{\partial y} \cdot (y_q - y_p) + \dots ,\qquad \text{Eqn.[1]}$$

where u(q) and u(p) are the values of u at q and p respectively, and u(p) is known.

Eqn. [1] holds for any scalar function, and in the case of a vector function, it holds for each vector component of the displacement vector field u. At a time $t_0$, the tagging locations are points p and q with distance vector A therebetween, and the target point T located at A/2. At a later time $t_1$, the strain in the target tissue changes and the points move to different locations p' and q'. The displacement at p is $u_p$ and at q it is $u_q$, as shown in FIG. 3.

If Eqn. [1] is applied to any component of the displacement vector u, it can be shown that:

$$u_q = u_p + du = u_p + \epsilon \cdot A \qquad \text{Eqn. [2],}$$

where A is the vector between q and p and $\epsilon$ is a 2×2 symmetric matrix (or 3×3 symmetric matrix for a 3 dimensional case) given by:

$$\varepsilon_{ij} = \frac{\partial u_i}{\partial x_j}, \qquad \text{Eqn.[3]}$$

where i, j=1, 2, 3 or x, y, z. $\epsilon$ is called the strain tensor of the rigid body.

Referring still to FIG. 3, the vector identity $u_p+(A+dA)=A+u_q=A+u_p+du$ is shown, which implies that:

$$du = dA = \epsilon \cdot A \qquad \text{Eqn. [4].}$$

From Eqn. [2] and Eqn. [4], target point T, located at λ/2 from p at $t_0$, will be at A/2+dA/2 from p' at $t_1$. That is, the target point T, located half-way between p and q at $t_0$, will be half way between p' and q' at any t>$t_0$, at location T'. Thus, the location of the target point T can be tracked at any time, t>$t_0$. The x-tag (i.e., the RF pencil beams at p and q) is clearly visible in a series of MR images for a time covering a number (N) of repetition times (TR) over which the series of MR images are acquired, such that t=N*TR. Thus, tracking and identification of the x-tag in an MR image is possible during this period. The period, t, for example, can be of the length of approximately 250 msec, with TR=50 msec and N=5.

Figure 4:
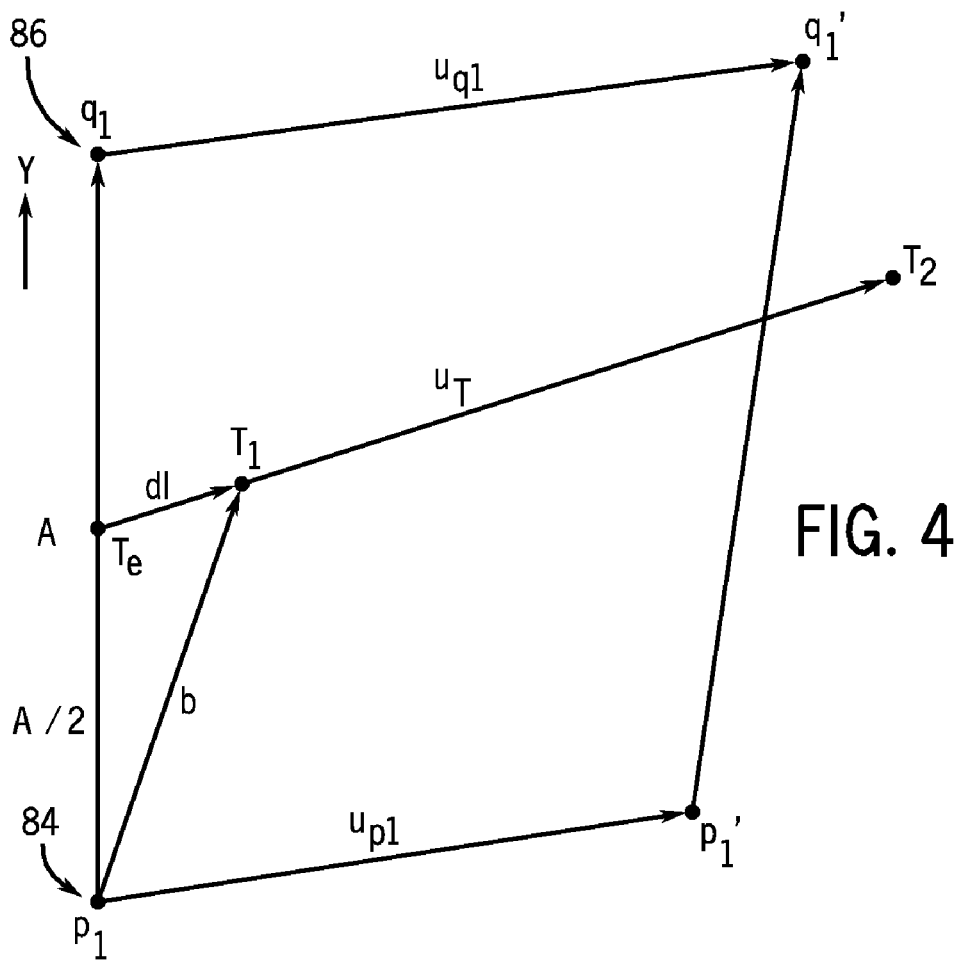
FIG. 4 is a schematic diagram of target point displacement and tracking in accordance with another embodiment of the invention.

After some time t<T1 (e.g., less than the T1/spin-lattice relaxation period for the tissue being imaged, such as 250 ms), the x-tag produced by the first pair of RF pencil beams and the spatial saturation induced in the tissue thereby dissipate. In order to allow for continued tracking of target point T, a subsequent RF pulse, in the form of a second pair (or refresher pair) of RF pencil beams, is applied to "refresh" the tagging. Referring now to FIG. 4, the second pair of RF pencil beams 84, 86 (e.g., a y-tag) are directed to tagging locations $p_1$, $q_1$ that are, ideally, positioned equidistant to and on opposite points from an updated location of target point T, shown as $T_1$ in FIG. 4. However, since there is a delay between the calculation time of the last tracked target point location and actual application of the next RF pulse (caused by the finite system time of calculation and download of the new frequency and RF waveform), the exact location of target point T about which the second pair of RF pencil beams 84, 86 are to be centered is not known and must be estimated.

An estimated updated location ($T_e$) of the target point T, about which the second pair RF pencil beams 84, 86 are to be centered, is determined by extrapolation. The RF pencil beams 84, 86 are then applied along an axis orthogonal to the previously applied RF pencil beams. As shown in FIG. 4, RF pencil beams 84, 86 are applied along the y-axis, which is orthogonal to the x-axis along which the first pair of RF pencil beams 80, 82 of FIG. 3 were applied, and at equidistant and opposite points from the extrapolated target point location $T_e$. Extrapolation location $T_e$ of target point T includes a small distance error term, dl, so the true updated location $T_1$ of the target point T is a distance dl away from the center point (i.e., the extrapolated location $T_e$) of the RF pencil beams 84, 86. The true updated location $T_1$ of the target point T is known from the previous x-tag, which is still seen, so the error vector dl is known, which allows for correction of the extrapolation error.

Referring still to FIG. 4, the new locations $p_1'$, $q_1'$ of the y-tag created by the second pair of RF pencil beams 84, 86 is tracked similar to that set forth above with respect to FIG. 3. Thus, at a later pre-determined time (e.g., 250 msec), a next updated location, $T_2$, of the target point T can be found. The $T_2$ location can be found by calculating the translation vector $u_T$ using Eqns. [2] and [4]. That is, the translation of points $q_1$, $p_1$, and $T_1$ to $q_1'$, $p_1'$, and $T_2$ is $u_{q1}$, $u_{p1}$, and $u_T$, respectively, and can be found by:

$$du_T = u_T - u_{p1} = \varepsilon \cdot b = \varepsilon \cdot (A/2 + dl) = \frac{du_{q1}}{2} + \varepsilon \cdot dl \quad \text{Eqn.[5a]}$$

and $$du_{q1} = u_{q1} - u_{p1} = \varepsilon \cdot A \quad \text{Eqn. [5b]}.$$

Since $|dl| \ll |A|$ and $|du_{q1}| \gg \varepsilon \cdot dl$ in [5a], it can be determined that:

$$du_T = \frac{du_{q1}}{2} + \varepsilon \cdot dl \approx \frac{du_{q1}}{2}. \quad \text{Eqn.[6]}$$

The approximation in Eqn. [6] can be used to calculate $du_T$, but a more accurate calculation with Eq. [5a] is possible, provided the elements of the strain tensor $\varepsilon$ are known. The elements of the strain tensor can be calculated as follows: 1) since A (FIG. 2) is along the y-axis immediately after the y-tag is applied, then $$A = \begin{pmatrix} 0 \\ A \end{pmatrix},$$

where A is a scalar. From Eqn. [5b]:

$$du_{q1} = \varepsilon \cdot A = A \cdot \begin{pmatrix} \varepsilon_{12} \\ \varepsilon_{22} \end{pmatrix}, \quad \text{Eqn.[A1]}$$

where $du_{q1}$ and A are known; 2) $\varepsilon_{12}$ and $\varepsilon_{22}$ can be calculated using Eqn. [A1]. Immediately after the x-tag is applied, $$A = \begin{pmatrix} A \\ 0 \end{pmatrix}$$

and $$du_{q1} = \varepsilon \cdot A = A \cdot \begin{pmatrix} \varepsilon_{11} \\ \varepsilon_{21} \end{pmatrix} \quad \text{Eqn.[A2]}$$

The target point T can thus be tracked for a time covering a number (N) of repetition times (TR), t=N*TR by using Eqn. [6] or Eqn. [5a].

Figure 5:
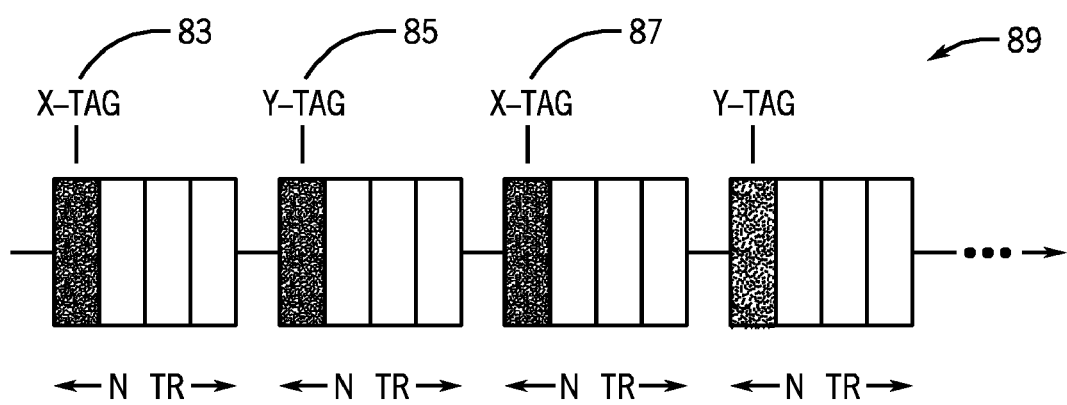
FIG. 5 is a diagram of a RF pencil beam tagging sequence in accordance with an embodiment of the invention.

The sequence described above can be followed for the application of additional RF pencil beam tags (e.g., additional or refresher RF pencil beam tags), as shown in FIG. 5. That is, after application of an initial x-tag 83 and a subsequent y-tag 85, the next tagging RF pulse 87 would be applied along the x-axis, with the middle point between the RF pencil beams being extrapolated to be as close as possible to the true updated locations for the target point. Since the previous y-tag is still visible, the error dl (FIG. 4) is known, and the translation UT of the target point can be found using Eqn. [6], with y replaced by x for a period of t=N*TR. The sequence of tag applications 89 and target point calculations can be repeated for a desired time period, such as until the end of an MR guided, focused ultrasound procedure.

From the above-described embodiments, it follows that the error dl (FIG. 4) of the extrapolation step (at the time of the tag refreshment) is measured and taken into account. At each tag refreshment step, when switching from an x-tag to a y-tag, or vice-versa, the mid-point of the new tag is applied as close as possible to the known target point. Therefore, the error dl does not increase with time. However, if there are errors, they may still accumulate, for example, as $\sqrt{N}$, where N is the number of previous tag switches, since the current target point location is based on a location determined in a previous tag, which may have the same error as in the current tag. To avoid error accumulation, each image complex cross-correlation with previous images may be calculated to make sure that the target point location in similar images is less than some specified distance. If the complex cross-correlation is larger than an allowed amount, the target point location can be reset to the target point location of the most similar image.

Figure 6:
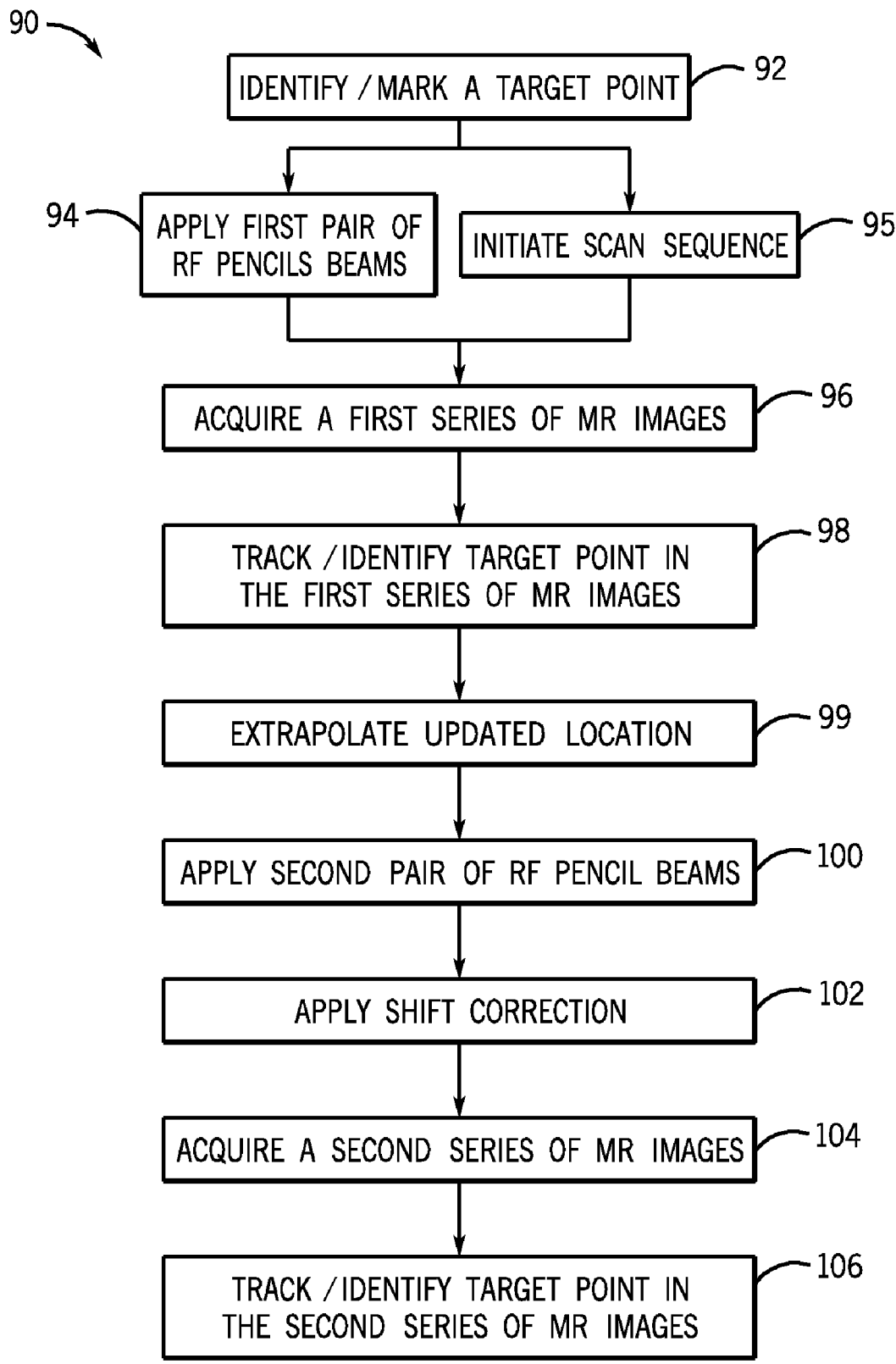
FIG. 6 is a flowchart illustrating a target point tracking technique in accordance with an embodiment of the invention.

Referring now to FIG. 6, a technique or method 90 for tracking a target point of tissue using a double pencil beam RF pulse is provided. The technique 90 begins at STEP 92 with the identification and marking of a target point in biological tissue of a patient. The method continues at STEP 94 with application of a first RF pulse that comprises a first pair of two-dimensional (2D), spatially selective RF pencil beams (i.e., an x-tag) directed to tagging locations in the tissue that are equidistant from (and on opposite sides of) the target point. The RF pencil beams are configured to spatially saturate the tissue at the tagging locations so as to allow for the identification of the MR signal from the target point.

Concurrent with the application of the first pair of RF pencil beams, a desired scan sequence is initiated at STEP 95 in which a series of RF pulses and gradient pulses are produced to excite nuclei in the patient and generate MR signals. At STEP 96, a first series of MR images are acquired that result from the scan sequence. In each of the MR images, the saturation points created by the RF pencil beams are visible, such that the target point in the biological tissue can be tracked. That is, for tissue exhibiting an approximately constant strain tensor around the target point, the target point will remain at the mid-point between the two RF pencil beam points/tagging locations, thus allowing for continuous tracking of the target point and the identification of the target point in the series of MR images, as shown at STEP 98.

To continue to track the location of the target point past a T1 relaxation decay period of the first applied pair of RF pencil beams, a second (or refresher) RF pulse that is directed along an axis orthogonal to the axis of the previous pair of RF pencil beams (e.g., applied along the y-axis) is applied to the tissue to induce spatial saturation at newly determined tagging locations. The second RF pulse includes a second pair of RF pencil beams that are directed about a mid-point that is located at an estimated and updated location of the target point. That is, due to system latency, the second RF pulse is applied before determination of an actual updated location of the target point. An updated location is extrapolated at STEP 99 to allow for timely application of the second pair of RF pencil beams. At STEP 100, the second RF pulse is applied along the orthogonal axis to the tissue such that the extrapolated update location is positioned therebetween.

The actual updated location of the target point is known from the previous x-tag and thus allows for the determination of a shift correction (see dl in FIGS. 3 and 4). The shift correction can be applied, as shown at STEP 102, to correct for the displacement between the extrapolated updated location and the actual updated location. While the second pair of RF pencil beams are being directed to their tagging locations and while the shift correction is being calculated, a second series of MR images is acquired at STEP 104. The implementation of the shift correction allows for accurate tracking of the target point and the identification of the target point in the second series of MR images, as shown at STEP 106. The series of STEPS 99-106 can be repeated a desired number of times to apply additional pairs of RF pencil beams (as illustrated in FIG. 5), so as to allow for target point tracking for the duration of a medical procedure (e.g., over the course of a focused ultrasound treatment). The technique 90 can be ended at any time desired by a system operator.

A technical contribution for the disclosed method and apparatus is that it provides for a computer implemented technique of MR based tracking of a tissue point using a double pencil beam RF pulse.

Therefore, according to one embodiment of the invention, a magnetic resonance imaging (MRI) apparatus includes a plurality of gradient coils positioned about a bore of a magnet, an RF coil assembly coupled to a pulse generator to emit RF pulse sequences and arranged to receive resulting MR signals from a subject of interest, and a system control coupled to the plurality of gradient coils and the RF coil assembly. The system control is programmed to cause the RF coil assembly to emit a first RF pulse comprising a first pair of two-dimensional (2D) spatially selective beams, each of the beams being directed to a respective tagging location in the subject of interest and wherein the tagging locations are equidistant from a pre-determined point-of-interest. The system control is further programmed to acquire a first series of MR images from the subject of interest, identify the first pair of 2D spatially selective beams in each MR image in the first series of MR images, and track a position of the point-of-interest based on the identified 2D spatially selective beams in the first series of MR images.

According to another embodiment of the invention, a method for tracking a target point using magnetic resonance imaging (MRI) includes the steps of identifying a target point in a subject of interest, emitting a first tagging RF pulse to a first set of tagging locations positioned equidistant from and on opposite sides of the target point, and acquiring a first set of MR images from the subject of interest. The method also includes the steps of tracking a position of the first set of tagging locations over the first set of MR images and determining a location for the target point in each of the acquired MR images based on the tracked positions of the first set of tagging locations, wherein the first tagging RF pulse comprises a first two-dimensional (2D) pencil beam and a second two-dimensional (2D) pencil beam, each of the first and second 2D pencil beams directed to a respective tagging location in the first set of tagging locations.

According to yet another embodiment of the invention, a computer readable storage medium has a computer program stored thereon representing a sequence of instructions. When executed by a computer, the computer program causes the computer to cause transmission of a pair of pencil beam RF pulses positioned about a point-of-interest located at a mid-point between the pair of pencil beam RF pulses and acquire a plurality of magnetic resonance (MR) images during the transmission of the pair of pencil beam RF pulses. The computer program further causes the computer to track a location of saturation points generated by the pair of pencil beam RF pulses over the plurality of MR images and determine a shift in location of the point-of-interest in each of the plurality of MR images based on the location of the saturation points.

The present invention has been described in terms of the preferred embodiments, and it is recognized that equivalents, alternatives, and modifications, aside from those expressly stated, are possible and within the scope of the appending claims. The order and sequence of process or method steps may be varied or re-sequenced according to alternative embodiments.

What is claimed is:

1. A magnetic resonance imaging (MRI) apparatus comprising:
   a plurality of gradient coils positioned about a bore of a magnet;
   an RF coil assembly coupled to a pulse generator to emit RF pulse sequences and arranged to receive resulting MR signals from a subject of interest; and
   a system control coupled to the plurality of gradient coils and the RF coil assembly, the system control programmed to:
      cause the RF coil assembly to emit a first RF pulse comprising a first pair of two-dimensional (2D) spatially selective beams, each of the beams being directed to a respective tagging location in the subject of interest and wherein the tagging locations are equidistant from a pre-determined point-of-interest;
      acquire a first series of MR images from the subject of interest;
      identify the first pair of 2D spatially selective beams in each MR image in the first series of MR images; and
      track a position of the point-of-interest based on the identified 2D spatially selective beams in the first series of MR images.

2. The MRI apparatus of claim 1, wherein the first pair of 2D spatially selective beams comprise symmetrical Gaussian-shaped 2D pencil beams.

3. The MRI apparatus of claim 1, wherein the first pair of 2D spatially selective beams are configured to spatially saturate the tagging locations in the subject of interest.

4. The MRI apparatus of claim 1, wherein each of the 2D spatially selective beams are directed to a tagging location on opposite sides of the point-of-interest such that the point-of-interest is located at a mid-point between each of the 2D spatially selective beams.

5. The MRI apparatus of claim 4, wherein the first pair of 2D spatially selective beams are positioned along an x-axis.

6. The MRI apparatus of claim 1, wherein the system control is further programmed to determine an estimated updated location for the point-of-interest and an actual updated location for the point-of-interest after acquisition of the first series of MR images based on a predetermined displacement between the estimated updated location and the actual updated location.

7. The MRI apparatus of claim 6, wherein the system control is further programmed to:

cause the RF coil assembly to emit a second RF pulse comprising a second pair of 2D spatially selective beams, each of the beams in the follow-up RF pulse being directed to a respective tagging location in the subject of interest and wherein the tagging locations of the second RF pulse are equidistant from the estimated updated location for the point-of-interest;

acquire a second series of MR images for the subject of interest;

identify the second pair of 2D spatially selective beams in each MR image in the second series of MR images; and track a position of the point-of-interest in the second series of MR images based on the identified 2D spatially selective beams.

8. The MRI apparatus of claim 7, wherein the system control is further programmed to apply a shift correction to determine a corrected position for the tracked point-of-interest in the second series of MR images, the shift correction accounting for the displacement between the estimated updated location and the actual updated location.

9. The MRI apparatus of claim 7, wherein each of the 2D spatially selective beams of the second RF pulse are directed to a tagging location on opposite sides of the point-of-interest such that the point-of-interest is located at a mid-point between each of the 2D spatially selective beams, the second pair of 2D spatially selective beams being positioned along a y-axis.

10. The MRI apparatus of claim 7, wherein the acquisition of each of the first and second series of MR images occurs within a time period less than a spin-lattice relaxation time of a tissue being imaged.

11. The MRI apparatus of claim 6, wherein the system control is further programmed to cause the RF coil assembly to emit additional RF pulses, and wherein each of the additional RF pulses comprises a pair of 2D spatially selective beams positioned along an axis orthogonal to the axis of the immediately preceding RF pulse.

12. A method for tracking a target point using magnetic resonance imaging (MRI) comprising:

identifying a target point in a subject of interest;

emitting a first tagging RF pulse to a first set of tagging locations positioned equidistant from and on opposite sides of the target point;

acquiring a first set of MR images from the subject of interest tracking a position of the first set of tagging locations over the first set of MR images; and determining a location for the target point in each of the acquired MR images based on the tracked positions of the first set of tagging locations;

wherein the first tagging RF pulse comprises a first two-dimensional (2D) pencil beam and a second two-dimensional (2D) pencil beam, each of the first and second 2D pencil beams directed to a respective tagging location in the first set of tagging locations.

13. The method of claim 12, further comprising:

determining an estimated updated location for the target point;

emitting a second tagging RF pulse to a second set of tagging locations positioned equidistant from and on opposite sides of the estimated updated location of the target point, the second tagging RF pulse comprising a first 2D pencil beam and a second 2D pencil beam, each of the first and second 2D pencil beams directed to a respective tagging location in the second set of tagging locations;

acquiring a second set of MR images from the subject of interest;

tracking a position of the second set of tagging locations over the second set of MR images; and determining a location of the target point in each of the second set of MR images based on the tracked second set of tagging locations.

14. The method of claim 13, further comprising:

determining an actual updated location for the target point;

determining a displacement between the estimated updated location and the actual updated location; and applying a correction to the location of the target point in each of the second set of MR images based on the determined displacement.

15. The method of claim 13, wherein the second set of tagging locations is oriented orthogonal to the first set of tagging locations.

16. The method of claim 13, wherein the first tagging RF pulse and the second tagging RF pulse are each configured to spatially saturate the first and second sets of tagging locations, respectively.

17. The method of claim 13, wherein the second tagging RF pulse is emitted after the first tagging RF pulse and within a time that is less than a T1 decay period of the tissue.

18. The method of claim 12, wherein the target point and the tagging locations are located within tissue of the subject of interest.

19. A computer readable storage medium having a computer program stored thereon and representing a sequence of instructions that when executed by a computer causes the computer to:

cause transmission of a pair of pencil beam RF pulses positioned about a point-of-interest located at a mid-point between the pair of pencil beam RF pulses;

acquire a plurality of magnetic resonance (MR) images during the transmission of the pair of pencil beam RF pulses;

track a location of saturation points generated by the pair of pencil beam RF pulses over the plurality of MR images; and determine a shift in location of the point-of-interest in each of the plurality of MR images based on the location of the saturation points.

20. The computer readable storage medium of claim 19, wherein the computer program further causes the computer to determine an estimated updated location and an actual updated location for the point-of-interest at a pre-determined time, the pre-determined time falling within a T1 period of a tissue being imaged.

21. The computer readable storage medium of claim 20, wherein the computer program further causes the computer to:

cause transmission of a pair of refresher pencil beam RF pulses positioned about the estimated updated location for the point-of-interest, the point-of-interest being located at a mid-point between the pair of refresher pencil beam RF pulses;

acquire a second plurality of MR images during the transmission of the pair of refresher pencil beam RF pulses;

track a location of saturation points generated by the pair of refresher pencil beam RF pulses over the second plurality of MR images; and determine a shift in location of the point-of-interest in each of the second plurality of MR images based on the location of the saturation points.

22. The computer readable storage medium of claim 21, wherein the computer program further causes the computer to determine a positional error of the point-of-interest in each of the second plurality of MR images based on the estimated updated location and the actual updated location.

23. The computer readable storage medium of claim 21, wherein the pair of pencil beam RF pulses are located along an x-axis and the pair of refresher pencil beam RF pulses are located along a y-axis.

* * * * *